(12) United States Patent
Yoon

(10) Patent No.: US 7,129,768 B2
(45) Date of Patent: Oct. 31, 2006

(54) FUSE CIRCUIT

(75) Inventor: Hyuck Soo Yoon, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/879,131

(22) Filed: Jun. 30, 2004

(65) Prior Publication Data

US 2005/0146373 A1    Jul. 7, 2005

(30) Foreign Application Priority Data

Jan. 6, 2004    (KR) .................... 10-2004-0000581

(51) Int. Cl.
*H01H 37/76*    (2006.01)
(52) U.S. Cl. ..................................... 327/525
(58) Field of Classification Search ............... 327/525, 327/526; 365/96, 225.5, 225.7
See application file for complete search history.

(56) References Cited

U.S. PATENT DOCUMENTS

| | | | |
|---|---|---|---|
| 3,533,088 A * | 10/1970 | Rapp | ..................... 365/230.06 |
| 4,689,494 A | 8/1987 | Chen et al. | |
| 5,386,386 A * | 1/1995 | Ogihara | ..................... 365/200 |
| 5,663,658 A | 9/1997 | Cowles et al. | |
| 6,026,037 A * | 2/2000 | Hong | ..................... 365/200 |
| 6,154,389 A | 11/2000 | Chung et al. | |
| 6,345,003 B1 | 2/2002 | Choi | |
| 6,430,100 B1 | 8/2002 | Kim | |
| 6,819,160 B1 * | 11/2004 | Saitoh | ..................... 327/525 |

FOREIGN PATENT DOCUMENTS

| | | |
|---|---|---|
| JP | 10-116498 | 5/1998 |
| JP | 10-275494 | 10/1998 |
| JP | 11-016386 | 1/1999 |

* cited by examiner

*Primary Examiner*—My-Trang Nu Ton
(74) *Attorney, Agent, or Firm*—Heller Ehrman LLP

(57) ABSTRACT

A fuse circuit comprises a plurality of enable fuse units and a plurality of fuse sets. Current flows at a reset mode in the plurality of enable fuse units, and the flowing of current is controlled by enable signals outputted from the plurality of enable fuse units in the plurality of fuse sets. In the fuse circuit, a fuse set connected to the end of the enable fuse unit whose fuse is disconnected selectively performs a reset operation, thereby reducing peak current to decrease the whole current consumption.

16 Claims, 4 Drawing Sheets

US 7,129,768 B2

FUSE CIRCUIT

BACKGROUND OF THE INVENTION

1. Field of the Invention

The present invention generally relates to a fuse circuit, and more specifically, to a technology of reducing current consumption by reducing peak current in a reset mode of a fuse circuit used for analysis and repair of memory design.

2. Description of the Prior Art

Generally, a fuse circuit has been widely used for analysis and repair of memory design.

FIG. 1 is a diagram of a conventional fuse circuit.

The conventional fuse circuit comprises enable fuse units EF1 and EF2, fuse sets 10 and 20 each corresponding to the enable fuse units EF1 and EF2. The fuse sets 10 and 20 comprise a plurality of fuse units F0~F11. If the enable fuse units EF1 and EF2 are activated, the conventional fuse circuit operates the plurality of fuse units F0~F11 to store address information of defect cells.

FIG. 2 is a circuit diagram of the enable fuse units EF1 and EF2 or a plurality of fuse units F0~F11.

The enable fuse units EF1 and EF2 or the plurality of fuse units F0~F11 comprise a fuse f1, NMOS transistors N1~N3, and inverters IV1 and IV2.

The fuse f1 is connected between a power voltage terminal VDD and the NMOS transistor N1. The NMOS transistor N1 connected between the fuse f1 and the NMOS transistor N2 has its gate to receive a reset signal RESET.

The NMOS transistor N2, a constant-current device which is connected between the NMOS transistor N1 and a ground voltage terminal, receives a power voltage VDD at its gate and is always turned on.

The inverters IV1 and IV2, connected serially, buffer an output signal from the common node of the fuse f1 and the NMOS transistor N1.

The NMOS transistor N3 has a drain connected to an input terminal of the inverter IV1, a source connected to the ground voltage terminal and a gate to receive an output signal from the inverter IV1. Here, if the NMOS transistor N3 is turned on by the output signal from the inverter IV1, the NMOS transistor N3 precharges the input terminal of the inverter IV1.

The above-described conventional fuse unit checks through the reset signal RESET whether the fuse f1 is turned on or off.

If the NMOS transistor N1 receives the reset signal RESET as a pulse type, the NMOS transistor N1 is turned on and penetration-current IDD flows. The NMOS transistor N2 is continuously kept on because the power voltage VDD is applied to the gate of the NMOS transistor N2.

When the NMOS transistor N1 is turned on, a high level signal is applied to a node NO1 if the fuse f1 is connected, and a low level signal is applied to a node NO1 if the fuse f1 is disconnected.

In this way, the conventional fuse circuit performs a reset operation to check whether the fuse f1 is turned on or off. But, if the reset signal RESET is activated, the conventional fuse circuit operates the fuse sets 10 and 20 at the same time regardless of whether the fuse sets 10 and 20 are used or not so that a large amount of the peak current generated instantly flows.

As a result, the conventional fuse circuit requires a large amount of current when the reset operation of the fuse circuit is performed, and the generated peak current causes power noise of the fuse, thereby destabilizing the operation of the fuse circuit.

SUMMARY OF THE INVENTION

Accordingly, it is an object of the present invention to provide a fuse circuit comprising a fuse set for selectively performing a reset operation only in a reset mode of the fuse circuit, thereby reducing peak current.

In an embodiment, a fuse circuit comprises a plurality of enable fuse units and a plurality of fuse sets. The plurality of enable fuse units output an enable signal corresponding to the connection state of a first fuse in response to a reset signal. The plurality of fuse sets connected in parallel to the enable fuse unit selectively control current flowing in a second fuse in response to the enable signal and output address information corresponding to a connection state of the second fuse.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be describe in detail with reference to the accompanying drawings.

Figure 1:
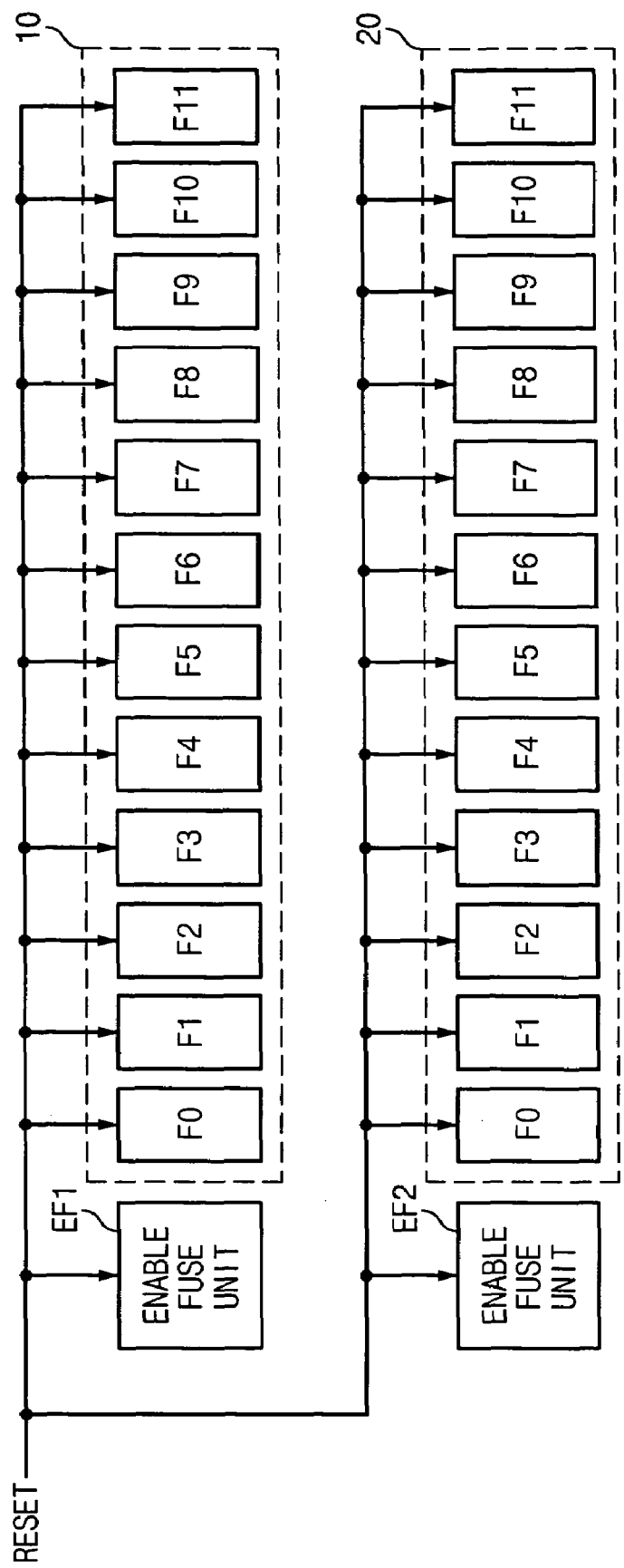
FIG. 1 is a diagram of a conventional fuse circuit.
Figure 2:
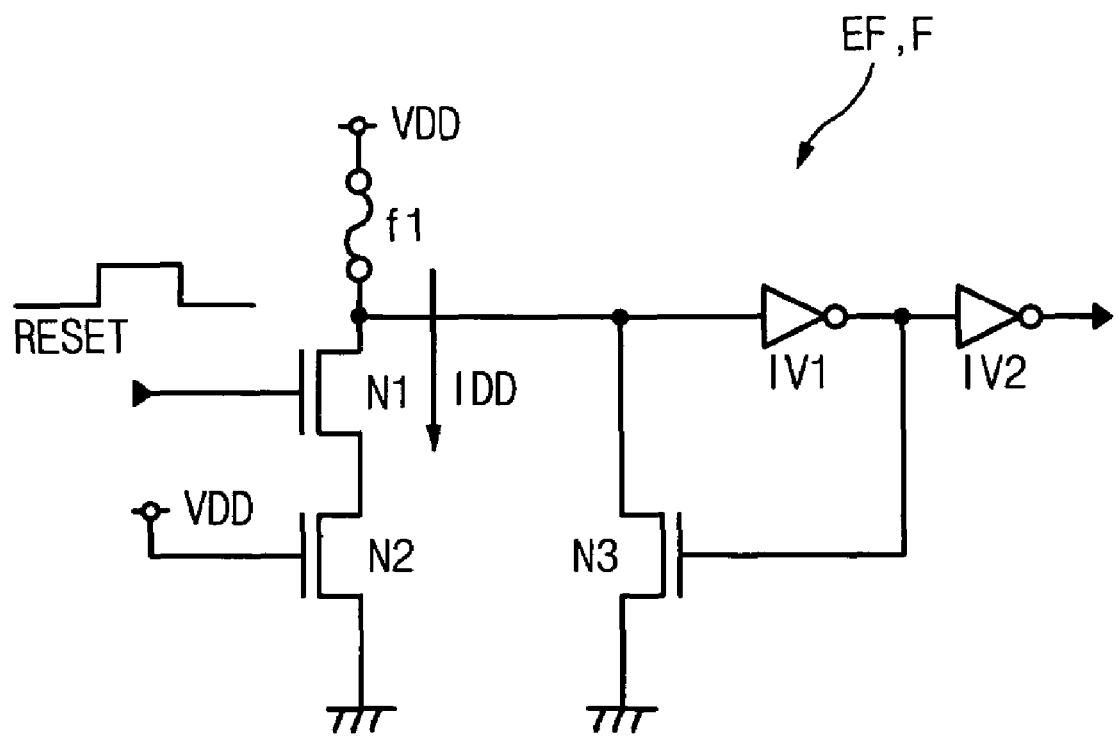
FIG. 2 is a circuit diagram of an enable fuse unit and a fuse unit of FIG. 1.
Figure 3:
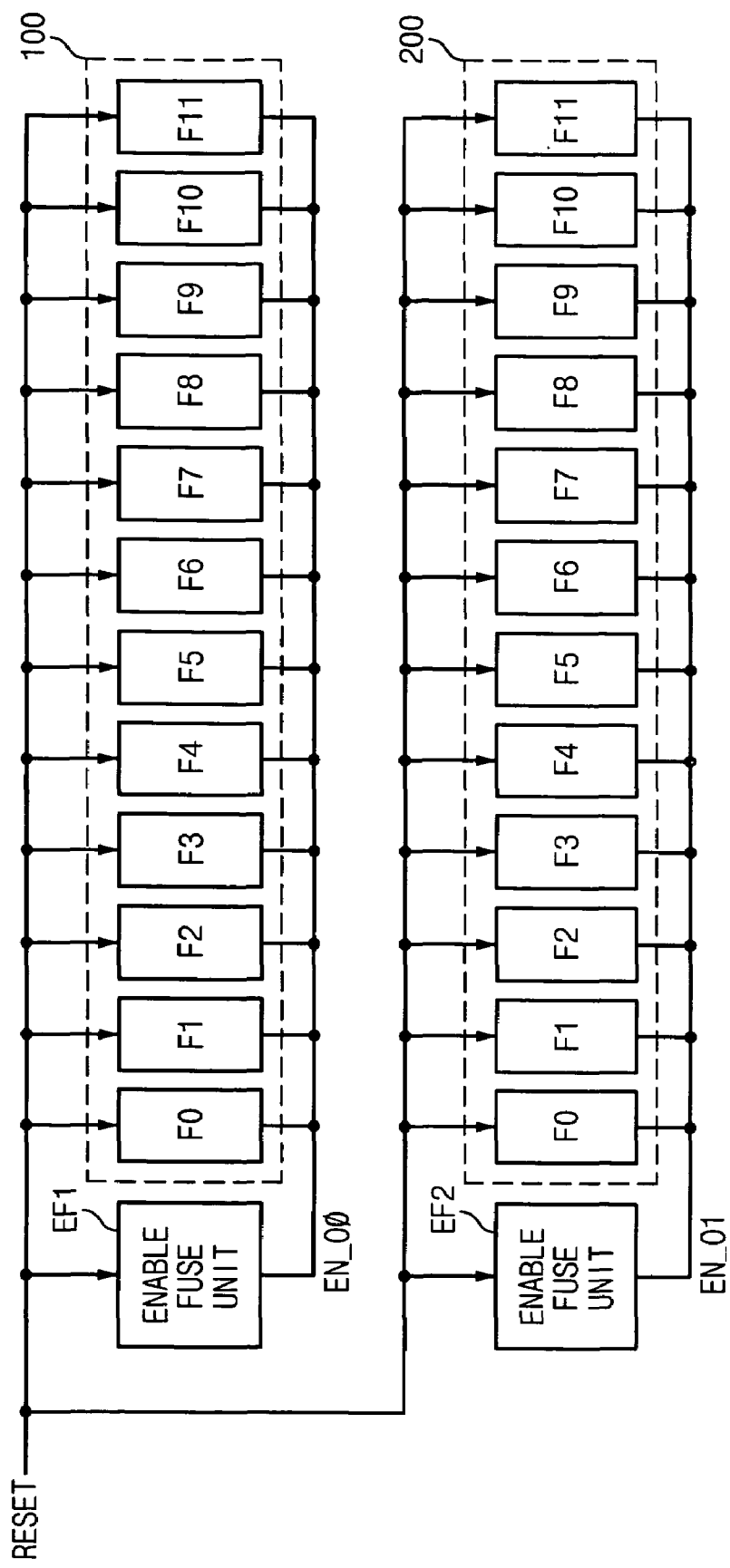
FIG. 3 is a diagram of a fuse circuit according to an embodiment of the present invention.

FIG. 3 is a diagram of a fuse circuit according to an embodiment of the present invention.

In an embodiment, the fuse circuit comprises enable fuse units EF1 and EF2 connected in parallel to fuse sets 100 and 200, respectively.

The enable fuse units EF1 and EF2 have current flowing basically at a reset mode, and control the enable state of the fuse sets 100 and 200.

The fuse sets 100 and 200, each corresponding to the enable fuse units EF1 and EF2 comprise a plurality of fuses F0~F11 connected in parallel, respectively. The current flowing in the plurality of fuses F0~F11 is controlled by the enable fuse units EF1 and EF2. The fuse sets 100 and 200 are reset depending on output states from the enable fuse units EF1 and EF2, respectively.

Figure 4:
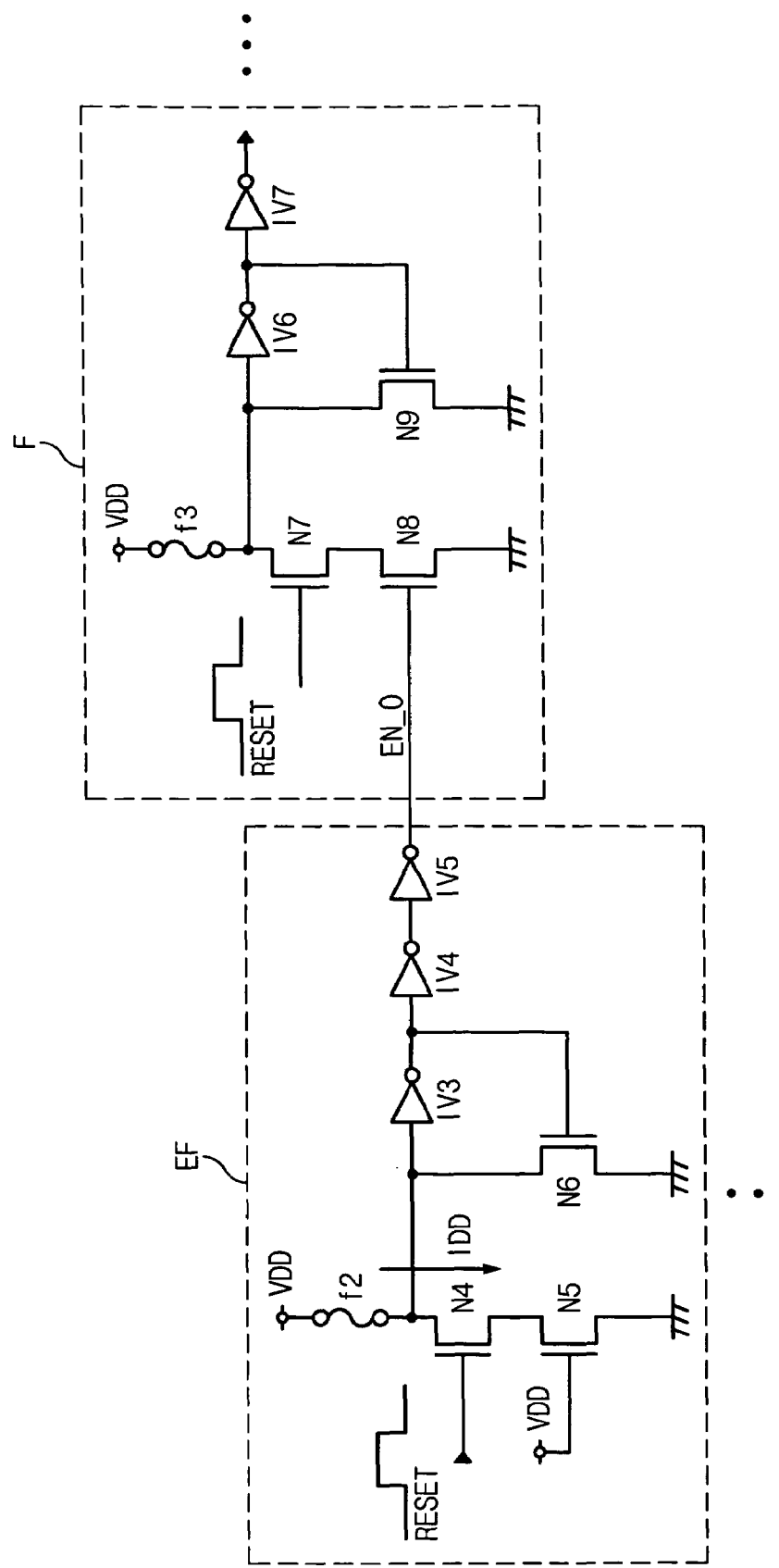
FIG. 4 a circuit diagram of an enable fuse unit and a fuse unit of FIG. 3.

FIG. 4 is a circuit diagram of the enable fuse unit EF and the fuse set F of FIG. 3.

The enable fuse unit EF comprises a fuse f2, NMOS transistors N4~N6, and inverters IV3~IV5. The fuse f2 is connected between a power voltage terminal VDD and the NMOS transistor N4. The NMOS transistor N4 connected between the fuse f2 and the NMOS transistor N5 has a gate to receive a reset signal RESET.

The NMOS transistor N5, a constant-current device which is connected between the NMOS transistor N4 and a ground voltage terminal, receives a power voltage VDD at its gate and is continuously turned on.

The inverters IV3~IV5, connected serially, buffer an output signal from the common node of the fuse f2 and the NMOS transistor N4, and output an enable signal EN_0.

The NMOS transistor N6 has a drain connected to an input terminal of the inverter IV3, a source connected to the ground voltage terminal and a gate to receive an output signal from the inverter IV3. If the NMOS transistor N6 is turned on, the NMOS transistor N6 and the inverter IV3 which form a latch structure precharge the input terminal of the inverter IV3.

The above-described enable fuse unit EF outputs the enable signal EN_O of a high level only when the connection of the fuse f2 is disconnected, thereby driving the fuse unit F connected to the end of the enable fuse unit EF.

Each of the plurality of fuse units F in the fuse sets 100 and 200 comprises a fuse f3, NMOS transistors N7~N9, and inverters IV6 and IV7.

The fuse f3 is connected between the power voltage terminal VDD and the NMOS transistor N7.

The NMOS transistor N7 connected between the fuse f3 and the NMOS transistor N8 has a gate to receive the reset signal RESET.

The NMOS transistor N8 connected between the NMOS transistor N7 and the ground voltage terminal has a gate to receive the enable signal EN_O outputted from the enable fuse unit EF.

The inverters IV6 and IV7 buffer an output signal from the common node of the fuse f3 and the NMOS transistor N7.

The NMOS transistor N9 has a drain connected to an input terminal of the inverter IV6, a source connected to the ground voltage terminal and a gate to receive an output signal from the inverter IV6. If the NMOS transistor N9 is turned on, the NMOS transistor N9 and the inverter IV6 which form a latch structure precharge the input terminal of the inverter IV6.

Hereinafter, the operation of the fuse circuit according to an embodiment of the present invention is described.

If the reset signal RESET is applied as a pulse type to check whether the fuse f2 is turned on/off, the NMOS transistor N4 is turned on. Here, the NMOS transistor N5 as a constant-current device is continuously kept on.

If the NMOS transistor N4 is turned on, the penetration-current IDD flows, and the enable fuse unit EF outputs the enable signal EN_O of a low level when the fuse f2 is connected and the enable signal EN_O of a high level when the fuse f2 is disconnected.

The NMOS transistor N8 is turned off if the enable signal EN_O is at the low level, and the NMOS transistor N8 is turned on if the enable signal EN_O is at the high level. As a result, the penetration-current IDD flows.

Here, if the NMOS transistor N8 is turned on, the fuse unit F outputs a high level signal when the fuse f3 is connected, and a low level signal when the fuse f3 is disconnected.

That is, when the fuse f2 is connected, the enable fuse unit EF outputs enable signal EN_O of the low level, and the NMOS transistor N8 is kept off. As a result, the penetration-current IDD does not flow in the unused fuse set, thereby reducing current consumption.

On the other hand, when the fuse f2 is disconnected, the enable fuse unit EF outputs the enable signal EN_O of the high level, and the NMOS transistor N8 is turned on. As a result, the penetration-current IDD flows in the NMOS transistor N8, and the NMOS transistor N7 is driven by the reset signal RESET, thereby enabling the reset operation of the fuse circuit.

For example, when the fuse set 200 is only used, the enable fuse unit EF1 of FIG. 4 outputs the enable signal EN_O0 of the low level, and the enable fuse unit EF2 outputs the enable signal EN_O1 of the high level. As a result, the fuse set 100 is not driven but the fuse set 200 is driven.

As discussed earlier, in a fuse circuit according to an embodiment of the present invention, only a fuse set used in a reset operation of the fuse circuit selectively performs the reset operation, thereby reducing current consumption and removing power noise.

What is claimed is:

1. A fuse circuit comprising:
    a plurality of enable fuse units each for outputting an enable signal corresponding to the connection state of a first fuse and performing a reset operation in response to a reset signal; and
    a plurality of fuse sets each connected in parallel to the plurality of enable fuse units and for performing the reset operation in response to the enable signal and the reset signal and outputting address information corresponding to a connection state of a second fuse;
    wherein each of the plurality of enable fuse units comprises:
        a first switching device for selectively connecting a common node of the first fuse and the first switching device to the ground in response to the reset signal, and
        a constant-current device connected serially to the first switching device.

2. The fuse circuit according to claim 1, wherein the constant-current device is a NMOS transistor receiving a power voltage at its gate.

3. The fuse circuit according to claim 1, further comprising a first latch unit for maintaining a level at the common node of the first fuse and the first switching device.

4. The fuse circuit according to claim 3, wherein the first latch unit comprises:
    a first inverter for inverting an output signal from the common node of the first fuse and the first switching device; and
    a second switching device for selectively connecting the common node of the first fuse and the first switching device to the ground in response to an output signal from the first inverter.

5. The fuse circuit according to claim 4, wherein the second switching device is a NMOS transistor.

6. The fuse circuit according to claim 5, further comprising a buffer unit for buffering an output signal from the first latch unit.

7. The fuse circuit according to claim 6, wherein the buffer unit comprises a plurality of inverters.

8. The fuse circuit according to claim 1, wherein each fuse set comprises a plurality of fuse units connected in parallel.

9. The fuse circuit according to claim 8, wherein each fuse unit does not perform a reset operation when the first fuse is connected and each fuse unit performs the reset operation when the first fuse is disconnected.

10. The fuse circuit according to claim 9, wherein the fuse unit comprises:
    a second fuse; and
    a third switching device for selectively connecting the common node of the second fuse and the third switching device to the ground in response to the reset signal.

11. The fuse circuit according to claim 10, further comprising a fourth switching device connected serially to the third switching device and controlled by an output signal from the corresponding enable fuse unit.

12. The fuse circuit according to claim 11, wherein the fourth switching device is a NMOS transistor.

13. The fuse circuit according to claim 11, further comprising a second latch unit for maintaining a level at the common node of the second fuse and the third switching device.

14. The fuse circuit according to claim 13, wherein the second latch unit comprises:

a second inverter for inverting an output signal from the common node of the second fuse and the third switching device; and a fifth switching device for selectively connecting the common node of the second fuse and the third switching device to the ground in response to an output signal from the second inverter.

15. The fuse circuit according to claim 14, wherein the fifth switching device is a NMOS transistor.

16. The fuse circuit according to claim 13, further comprising a third inverter for inverting an output signal from the second latch unit.

* * * * *